United States Patent
Tajalli et al.

(10) Patent No.: US 10,958,251 B2
(45) Date of Patent: Mar. 23, 2021

(54) MULTIPLE ADJACENT SLICEWISE LAYOUT OF VOLTAGE-CONTROLLED OSCILLATOR

(71) Applicant: Kandou Labs SA, Lausanne (CH)

(72) Inventors: Armin Tajalli, Salt Lake City, UT (US); Yohann Mogentale, Lausanne (CH); Fabio Licciardello, Lausanne (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/843,785

(22) Filed: Apr. 8, 2020

(65) Prior Publication Data
US 2020/0321915 A1    Oct. 8, 2020

Related U.S. Application Data

(60) Provisional application No. 62/831,165, filed on Apr. 8, 2019.

(51) Int. Cl.
| | |
|---|---|
| H03K 3/03 | (2006.01) |
| H03K 5/00 | (2006.01) |
| H03L 7/099 | (2006.01) |
| H03B 5/24 | (2006.01) |

(52) U.S. Cl.
CPC .......... *H03K 3/0322* (2013.01); *H03B 5/24* (2013.01); *H03K 2005/00208* (2013.01); *H03L 7/0995* (2013.01)

(58) Field of Classification Search
CPC ...... H03K 3/03; H03K 3/0315; H03K 3/0322; H03K 2005/00195; H03K 2005/00208; H03L 7/099; H03L 7/0995
See application file for complete search history.

(56) References Cited

U.S. PATENT DOCUMENTS

| | | |
|---|---|---|
| 4,839,907 A | 6/1989 | Saneski |
| 5,266,907 A | 11/1993 | Dacus |
| 5,528,198 A | 6/1996 | Baba et al. |
| 5,602,884 A | 2/1997 | Wieczorkiewicz et al. |

(Continued)

FOREIGN PATENT DOCUMENTS

| | | |
|---|---|---|
| CN | 203675093 U | 6/2014 |
| EP | 0740423 A2 | 10/1996 |

OTHER PUBLICATIONS

Loh, Mattew, et al., "A 3×9 Gb/s Shared, All-Digital CDR for High-Speed, High-Density I/O", IEEE Journal of Solid-State Circuits, vol. 47, No. 3, Mar. 2012, 641-651 (11 pages).

(Continued)

*Primary Examiner* — Ryan Johnson
(74) *Attorney, Agent, or Firm* — Invention Mine LLC

(57) ABSTRACT

Methods and systems are described for generating multiple phases of a local clock at a controllable variable frequency, using loop-connected strings of active circuit elements. A specific embodiment incorporates a loop of four active circuit elements, each element providing true and complement outputs that are cross-coupled to maintain a fixed phase relationship, and feed-forward connections at each loop node to facilitate high frequency operation. A particular physical layout is described that maximizes operating frequency and minimizes clock pertubations caused by unbalanced or asymmetric signal paths and parasitic node capacitances.

12 Claims, 6 Drawing Sheets

(56) References Cited

U.S. PATENT DOCUMENTS

| | | | |
|---|---|---|---|
| 5,629,651 A | 5/1997 | Mizuno | |
| 5,802,356 A | 9/1998 | Gaskins et al. | |
| 6,026,134 A | 2/2000 | Duffy et al. | |
| 6,122,336 A | 9/2000 | Anderson | |
| 6,307,906 B1 | 10/2001 | Tanji et al. | |
| 6,316,987 B1 | 11/2001 | Dally et al. | |
| 6,380,783 B1 | 4/2002 | Chao et al. | |
| 6,389,091 B1 | 5/2002 | Yamaguchi et al. | |
| 6,509,773 B2 | 1/2003 | Buchwald et al. | |
| 6,717,478 B1 | 4/2004 | Kim et al. | |
| 6,838,951 B1 | 1/2005 | Nieri et al. | |
| 7,078,978 B2 * | 7/2006 | Wakii | H03K 3/0322 331/45 |
| 7,102,449 B1 * | 9/2006 | Mohan | H03K 3/0322 327/57 |
| 7,199,728 B2 | 4/2007 | Dally et al. | |
| 7,336,112 B1 | 2/2008 | Sha et al. | |
| 7,532,697 B1 | 5/2009 | Sidiropoulos et al. | |
| 7,535,957 B2 | 5/2009 | Ozawa et al. | |
| 7,616,075 B2 | 11/2009 | Kushiyama | |
| 7,650,525 B1 | 1/2010 | Chang et al. | |
| 7,688,929 B2 | 3/2010 | Co | |
| 7,839,229 B2 | 11/2010 | Nakamura et al. | |
| 7,860,190 B2 | 12/2010 | Feller | |
| 8,036,300 B2 | 10/2011 | Evans et al. | |
| 8,253,454 B2 | 8/2012 | Lin | |
| 8,791,735 B1 | 7/2014 | Shibasaki | |
| 8,929,496 B2 | 1/2015 | Lee et al. | |
| 9,036,764 B1 | 5/2015 | Hossain et al. | |
| 9,059,816 B1 | 6/2015 | Simpson et al. | |
| 9,306,621 B2 | 4/2016 | Zhang et al. | |
| 9,374,250 B1 | 6/2016 | Musah et al. | |
| 9,397,868 B1 | 7/2016 | Hossain et al. | |
| 9,438,409 B1 | 9/2016 | Liao et al. | |
| 9,520,883 B2 | 12/2016 | Shibasaki | |
| 9,565,036 B2 | 2/2017 | Zerbe et al. | |
| 9,577,815 B1 | 2/2017 | Simpson et al. | |
| 9,602,111 B1 | 3/2017 | Shen et al. | |
| 9,906,358 B1 | 2/2018 | Tajalli | |
| 9,960,902 B1 | 5/2018 | Lin et al. | |
| 10,055,372 B2 | 8/2018 | Shokrollahi | |
| 10,374,787 B2 | 8/2019 | Tajalli | |
| 2003/0001557 A1 | 1/2003 | Pisipaty | |
| 2003/0146783 A1 | 8/2003 | Bandy et al. | |
| 2004/0092240 A1 | 5/2004 | Hayashi | |
| 2005/0024117 A1 | 2/2005 | Kubo et al. | |
| 2005/0084050 A1 | 4/2005 | Cheung et al. | |
| 2005/0117404 A1 | 6/2005 | Savoj | |
| 2005/0128018 A1 | 6/2005 | Meltzer | |
| 2005/0201491 A1 | 9/2005 | Wei | |
| 2005/0220182 A1 | 10/2005 | Kuwata | |
| 2005/0275470 A1 | 12/2005 | Choi | |
| 2006/0062058 A1 | 3/2006 | Lin | |
| 2006/0140324 A1 | 6/2006 | Casper et al. | |
| 2006/0232461 A1 | 10/2006 | Felder | |
| 2007/0001713 A1 | 1/2007 | Lin | |
| 2007/0001723 A1 | 1/2007 | Lin | |
| 2007/0047689 A1 | 3/2007 | Menolfi et al. | |
| 2007/0086267 A1 | 4/2007 | Kwak | |
| 2007/0146088 A1 | 6/2007 | Arai et al. | |
| 2007/0147559 A1 | 6/2007 | Lapointe | |
| 2007/0183552 A1 | 8/2007 | Sanders et al. | |
| 2007/0201597 A1 | 8/2007 | He et al. | |
| 2008/0007367 A1 | 1/2008 | Kim | |
| 2008/0111634 A1 | 5/2008 | Min | |
| 2008/0165841 A1 | 7/2008 | Wall et al. | |
| 2008/0181289 A1 | 7/2008 | Moll | |
| 2008/0317188 A1 | 12/2008 | Staszewski et al. | |
| 2009/0103675 A1 | 4/2009 | Yousefi et al. | |
| 2009/0167389 A1 | 7/2009 | Reis | |
| 2009/0195281 A1 | 8/2009 | Tamura et al. | |
| 2009/0231006 A1 | 9/2009 | Jang et al. | |
| 2009/0243679 A1 | 10/2009 | Smith et al. | |
| 2009/0262876 A1 | 10/2009 | Arima et al. | |
| 2009/0262877 A1 | 10/2009 | Shi et al. | |
| 2010/0033259 A1 | 2/2010 | Miyashita | |
| 2010/0090723 A1 | 4/2010 | Nedovic et al. | |
| 2010/0090735 A1 | 4/2010 | Cho | |
| 2010/0156543 A1 | 6/2010 | Dubey | |
| 2010/0180143 A1 | 7/2010 | Ware et al. | |
| 2010/0220828 A1 | 9/2010 | Fuller et al. | |
| 2011/0002181 A1 | 1/2011 | Wang et al. | |
| 2011/0025392 A1 | 2/2011 | Wu et al. | |
| 2011/0311008 A1 | 12/2011 | Slezak et al. | |
| 2012/0200364 A1 | 8/2012 | Iizuka et al. | |
| 2012/0206177 A1 | 8/2012 | Colinet et al. | |
| 2012/0235717 A1 | 9/2012 | Hirai et al. | |
| 2012/0327993 A1 | 12/2012 | Palmer | |
| 2013/0088274 A1 | 4/2013 | Gu | |
| 2013/0091392 A1 | 4/2013 | Valliappan et al. | |
| 2013/0093471 A1 | 4/2013 | Cho et al. | |
| 2013/0107997 A1 | 5/2013 | Chen | |
| 2013/0108001 A1 | 5/2013 | Chang et al. | |
| 2013/0207706 A1 | 8/2013 | Yanagisawa | |
| 2013/0243127 A1 | 9/2013 | Ito et al. | |
| 2013/0271194 A1 | 10/2013 | Madoglio et al. | |
| 2013/0285720 A1 | 10/2013 | Jibry | |
| 2013/0314142 A1 | 11/2013 | Tamura et al. | |
| 2014/0286381 A1 | 9/2014 | Shibasaki | |
| 2015/0078495 A1 | 3/2015 | Hossain et al. | |
| 2015/0117579 A1 | 4/2015 | Shibasaki | |
| 2015/0180642 A1 | 6/2015 | Hsieh et al. | |
| 2015/0220472 A1 | 8/2015 | Sengoku | |
| 2015/0256326 A1 | 9/2015 | Simpson et al. | |
| 2016/0056980 A1 | 2/2016 | Wang et al. | |
| 2016/0134267 A1 | 5/2016 | Adachi | |
| 2017/0228215 A1 | 8/2017 | Chatwin et al. | |
| 2017/0310456 A1 | 10/2017 | Tajalli | |
| 2018/0083763 A1 | 3/2018 | Black et al. | |
| 2018/0375693 A1 | 12/2018 | Zhou et al. | |

OTHER PUBLICATIONS

Riley, M. W., et al., "Cell Broadband Engine Processor: Design and Implementation", IBM Journal of Research and Development, vol. 51, No. 5, Sep. 2007, 545-557 (13 pages).

Ha, J.C., et al., "Unified All-Digital Duty-Cycle and phase correction circuit for QDR I/O interface", Electronic Letters, The Institution of Engineering and Technology, vol. 44, No. 22, Oct. 23, 2008, 1300-1301 (2 pages).

Ryu, Kyungho, et al., "Process-Variation-Calibrated Multiphase Delay Locked Loop With a Loop-Enbedded Duty Cycle Corrector", IEEE Transactions on Circuits and Systems, vol. 61, No. 1, Jan. 2014, 1-5 (5 pages).

Wang, Yi-Ming, et al., "Range Unlimited Delay-Interleaving and -Recycling Clock Skew Compensation and Duty-Cycle Correction Circuit", IEEE Transactions on Very Large Scale Integration (VLSI) Systems, vol. 23, No. 5, May 2015, 856-868 (13 pages).

\* cited by examiner

MULTIPLE ADJACENT SLICEWISE LAYOUT OF VOLTAGE-CONTROLLED OSCILLATOR

CROSS-REFERENCE TO RELATED APPLICATIONS

This application claims priority to U.S. Application No. 62/831,165, filed Apr. 8, 2019, entitled "Multiple Adjacent Slicewise Layout of Voltage-Controlled Oscillator", naming Armin Tajalli, which is hereby incorporated by reference in its entirety for all purposes.

REFERENCES

The following prior applications are herein incorporated by reference in their entirety for all purposes:

U.S. patent application Ser. No. 16/107,822 filed Aug. 21, 2018, entitled "HIGH PERFORMANCE PHASE LOCKED LOOP", naming Armin Tajalli, hereinafter referred to as [Tajalli I].

FIELD OF THE INVENTION

The present embodiments relate to communications systems circuits generally, and more particularly to obtaining a stable, correctly phased receiver clock signal from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In such vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device must be sampled (or their signal value otherwise recorded) at intervals best representing the original transmitted values, regardless of transmission channel delays, interference, and noise. Such Clock and Data Recovery (CDR) not only determines the appropriate sample timing, but may continue to do so continuously, providing dynamic compensation for varying signal propagation conditions.

Many known CDR systems utilize a Phase-Locked Loop (PLL) or Delay-Locked Loop (DLL) to synthesize a local receive clock having an appropriate frequency and phase for accurate receive data sampling.

BRIEF DESCRIPTION

To reliably detect the data values transmitted over a communications system, a receiver must accurately measure the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream. In general, the receiver embodiments of such timing methods are described as Clock-Data Recovery (CDR) or alternatively as Clock-Data Alignment (CDA) often based on Phase-Lock Loop (PLL) or Delay-Locked Loop (DLL) synthesis of a local receive clock having the desired frequency and phase characteristics.

In both PLL and DLL embodiments, a phase comparator compares the relative phase (and in some variations, the relative frequency) of a received reference signal and a local clock signal to produce an error signal, which is subsequently used to correct the phase and/or frequency of the local clock source and thus minimize the error. As this feedback loop behavior will lead to a given PLL embodiment producing a fixed phase relationship (as examples, 0 degrees or 90 degrees of phase offset) between the reference signal and the local clock, an additional fixed or variable phase adjustment is often introduced to permit the phase offset to be set to a different desired value (as one example, 45 degrees of phase offset) to facilitate receiver data detection.

In some embodiments, synthesis of additional local clock phases is desirable to enable multi-phase or pipelined processing of received data values, facilitate phase interpolation, and/or provide additional inputs to the phase detection process to reduce clock jitter and/or improve PLL closed-loop bandwidth. As one example, [Tajalli I] describes an embodiment in which multiple VCO phases and (optionally, multiple delayed) instances of a received clock reference are compared using a matrix of phase comparator elements, the multiple partial phase error signals of which are combined in a weighed summation to provide a VCO phase error correction.

Voltage-controlled oscillators utilizing loop-connected strings of active circuit elements are well represented in the art. The basic oscillation frequency of such an oscillator is determined by the total propagation time of the string of active element. Thus, to enable high-speed operation, a simple digital inverter having minimal propagation delay is typically used as the active element. Loop-connected strings of differential amplifiers or buffers are also known, with stable oscillation occurring as long as the overall phase shift at the desired oscillation frequency is an odd multiple of 180 degrees.

The loop oscillation frequency may be varied using a control signal that adjusts active circuit element delay, which may in turn be functions of circuit gain and switching threshold. Alternatively, the effective propagation delay may be increased by limiting the skew rate of signal transitions propagating between loop elements, either explicitly by constraining the output current drive of each active circuit element, or implicitly by constraining the supply voltage or current provided to each active circuit element.

Conveniently, an N-element loop oscillator inherently provides N multiple clock output phases, each typically offset by 180/N degrees of phase difference. Thus, a loop oscillator comprised of four stages can provide four distinct phases of oscillator output signal, and if each stage also provides inverted and non-inverted outputs, four additional phases from the complementary outputs.

DETAILED DESCRIPTION

Figure 1:
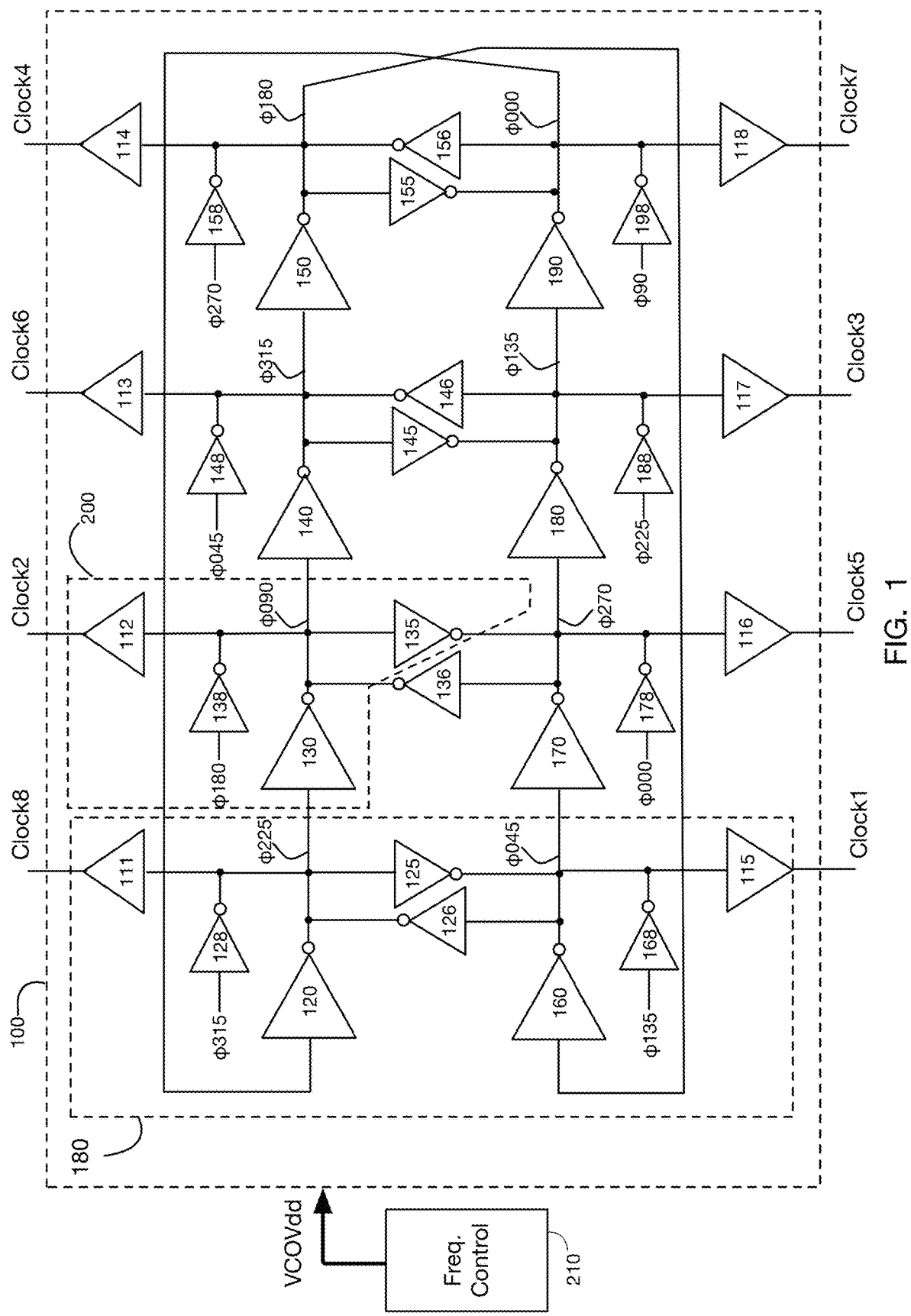
FIG. 1 is a block diagram showing one embodiment of a variable frequency loop oscillator.

To reliably detect the data values transmitted over a communications system, a receiver must accurately measure the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream. In general, the receiver embodiments of such timing methods are described as Clock-Data Recovery (CDR) or alternatively as Clock-Data Alignment (CDA) often based on Phase-Lock Loop (PLL) or Delay-Locked Loop (DLL) synthesis of a local receive clock having the desired frequency and phase characteristics.

A typical PLL is composed of a phase comparator that compares an external reference signal to an internal clock signal, a low pass filter that smooths the resulting error value to produce a clock control signal, and a variable frequency clock source (typically, a Voltage Controlled Oscillator or VCO) controlled by the smoothed error value, producing the internal clock signal presented to the phase comparator. In a well-know variation, such a PLL design may incorporate a clock frequency divider between the VCO and the phase comparator, allowing a higher-frequency clock output to be phase locked to a lower-frequency reference signal.

In an alternative Delay-Locked Loop (DLL) embodiment, the variable frequency clock source is replaced by a variable delay element, its (optionally multiple tapped) outputs thus representing one or more successive time-delayed versions of the original input signal rather than successive cycles of an oscillator to be phase compared to the reference input signal. For the purposes of this document, the variable delay elements utilized in a DLL are considered functionally equivalent to the variable delay elements of a loop-connected oscillator VCO in a PLL embodiment.

In some embodiments, the PLL may synthesize additional local clock phases to enable multi-phase or pipelined processing of received data values, facilitate phase interpolation, and/or provide additional inputs to the phase detection process to reduce clock jitter and/or improve PLL closed-loop bandwidth. As one example, [Tajalli I] describes an embodiment in which multiple VCO phases and (optionally, multiple delayed) instances of a received clock reference are compared using a matrix of phase comparator elements, the multiple partial phase error signals of which are combined in a weighed summation to provide a VCO phase error correction.

A simple digital XOR gate may be used as a phase comparator. As a non-limiting example, an XOR between two square wave signals having a phase difference will result in a variable-duty-cycle waveform which, when low pass filtered into an analog error signal, results in a proportional error signal centered in its analog signal range when the two input signals have a 90-degree phase offset relationship. More complex finite state machine (FSM) phase comparator compare the relative arrival times of clock transitions, as one example using edge-triggered latches clocked respectively by the reference and internal clock signals, with the relative arrival time of the clock edges resulting in an "early" or "late" output signal that produces a corresponding correction of the VCO phase. Other FSM phase comparator embodiments are additionally sensitive to clock frequency differences, enabling faster initial loop lock at startup. Further embodiments accumulate multiple phase error measurements into a integral error result which may be used alone or in combination with a short-term proportional result as a VCO control value. Some embodiments incorporate some or all of these functions into firmware or software executing on a CPU, or implemented as a hardware state machine.

In most PLL embodiments, the error signal produced by the phase comparator is low pass filtered and applied as an analog control voltage used to adjust the VCO operating frequency.

The control signal used to adjust the VCO frequency may be comprised of multiple components; phase comparison of a reference and a local clock signal by a phase comparator, a matrix of multiple such comparisons as taught in [Tajalli I], the output of a FSM performing frequency or phase comparisons, or an integral error term derived from an accumulated history of phase measurements. In some embodiments, a first control signal component may correspond to a long time constant correction and a second control signal component may correspond to a short time constant correction. Identical or different weights or scaling factors may be applied to said first and second control components when they are combined.

In an alternative embodiment, all or part of the filtering operation are subsumed into the same digital processing used for phase comparison, with the digital error result applied to a digital-to-analog converter (DAC) to obtain an analog VCO control signal. In further embodiments, all or a portion of the VCO control signal may be applied in the digital domain.

Voltage-controlled oscillators based on loop-connected strings of active circuit elements are well represented in the art. In such oscillators, an initial signal transition propagates down the string of connected elements, appearing at consecutive element outputs after a delay determined by the signal propagation delay of the active circuit element. Thus, as one example offered without limitation, the initial signal transition would appear at the end of a series-connected string of four active circuit elements after (4*prop_delay), corresponding to one half-cycle of the oscillator. If the output is inverted and applied to the input (thus, the term "loop-connected") the oscillation will continue for another half period, resulting in a square wave output with a period of (2*Σ prop_delay), determined by the total propagation time Σ prop_delay of the string of active elements. The number of active circuit elements in the loop may vary, with oscillation occurring as long as the overall phase shift around the loop-connected string at the desired oscillation frequency is an odd multiple of 180 degrees. Thus, to enable high-speed oscillation, the string length is kept short and minimal-delay active elements such as simple digital inverters, amplifiers, or buffers are used.

The loop oscillation frequency may be varied using a control signal that adjusts an active circuit element parameter affecting propagation delay, such as gain, switching threshold, or output drive; low frequency embodiments are also known that incorporate configurable passive delay elements between active stages to provide additional control. At high frequencies, a significant component of an active element's propagation time can be the node charge/discharge time required for an output state change in one element to charge or discharge the parasitic capacitance of the interconnecting node and reach the switching threshold of the subsequent element's input. Under these conditions, the effective propagation delay may be varied by limiting the skew rate of signal transitions propagating between sequential loop elements, either by explicitly adjusting the output current drive capability or output impedance of each active circuit element, or by implicitly making such adjustment by varying the supply voltage or current provided to the active circuit elements.

Conveniently, an N-element loop oscillator inherently generates N multiple clock output phases as the output of consecutive active elements, each typically offset by an additional 180/N degrees of phase difference. In embodiments based on inverting active elements, an additional 180 degree offset (i.e. inversion) will be seen at odd-numbered outputs, using the input of the first element as the reference.

One embodiment of such an oscillator consists of a loop of four elements, where each element is a differential digital inverter composed of a pair of identical single-ended inverters supporting the noninverted-input-to-inverted output, and inverted-input-to-noninverted output paths, respectively. To provide the required odd number of inversions around the loop, the outputs of the fourth element are cross-connected to the inputs of the first element. In the illustration of FIG. 1, the first element is comprised of inverters 120 and 160, the second element of 130 and 170, the third element of 140 and 180, and the fourth element of 150 and 190.

Even though the embodiment of FIG. 1 includes eight inverters, the length of the loop is four loop elements because of the double loop-back of the output of inverter 150 and of inverter 190. Thus, the natural oscillation period is (2*4*prop_delay), not twice that value.

To maintain tight phase matching between inverted and non-inverted outputs of each loop element, each loop element output is cross-connected to its complementary output using back-to-back digital inverters, maintaining the desired 180 degree phase offset between them. In this embodiment, the back-to-back inverters provide bidirectional synchronization between complementary outputs, as well as introducing a small amount of hysteresis into node switching transitions. Thus, the output of the first loop element 180 inverter 120 is cross-connected to the output of inverter 160 by cross-coupled inverters 125 and 126, the output of 130 is cross-connected to the output of 170 by cross-coupled inverters 135 and 136, the output of 140 is cross-connected to the output of 180 by cross-coupled inverters 145 and 146, and the output of 150 is cross-connected to the output of 190 by cross-coupled inverters 155 and 156.

As the desired loop oscillation frequency approaches the design limits of the embodiment's integrated circuit process, each loop node is also driven with a small amount of feed-forward signal from a node 45 degrees earlier in the oscillation cycle (which, in the example four loop element differential topology, may be obtained from the complementary input of the preceding loop element). This feed-forward signal begins to drive the node in anticipation of the switching transition, allowing operation at a higher frequency than would otherwise be possible. In FIG. 1, this feed-forward may be seen in inverter 138 driving an inverted and delayed version of ø180 (thus corresponding to a non-inverted ø000) onto output node ø090 in anticipation of primary inverter 130 driving an inverted and delayed version of ø225 (thus corresponding to a non-inverted ø045) onto the same node, which after accounting for the propagation delay will be the expected ø090 result. Thus, in this example the feed-forward signal anticipates each corresponding change of primary output signal by 45 degrees, providing a beneficial pre-charging action which accelerates the transition of the output node.

Obviously, such anticipatory signaling cannot exceed that of the primary signal path, or spurious high-frequency oscillation can occur. Similarly, signaling on the cross-coupling path introduces hysteresis which delays switching transitions, so must also be constrained to be significantly less than that of the primary signal path. The amount of anticipatory and cross-coupled signaling may be controlled by scaling the size of the transistors (and thus their current drive capability) relative to the transistor size used on the primary signal path.

In one particular embodiment, feed-forward signaling was found to be of benefit at approximately 60% of the drive level of the primary signal path, with cross-coupling at approximately 40% of the drive level of the primary signal path. Smaller amounts of feed-forward signaling provided correspondingly smaller speed-up benefit. Larger amounts of cross-coupling increased the effective propagation delay of the active loop elements, and significantly smaller amounts reduced the desired locked phase relationship between the first and second loops.

Loop frequency adjustment is shown as being controlled by Frequency Control 210, which as an example produces a varying oscillator supply voltage VCOVdd, which powers all of the loop oscillator inverters.

To provide isolation and increased output drive capability, each clock phase produced by the loop oscillator is buffered by clock buffers 111 through 118, producing output clocks Clock1 through Clock8. To insure full-swing clock outputs, these clock buffers are powered by the full Vdd supply voltage.

Observing the block diagram of FIG. 1, it is obvious that loop oscillator 100 may be partitioned into eight identical sections, 200 being one example, each such section incorporating one half of the inverters needed within each loop element, and producing one buffered clock output. As shown, the VCO of FIG. 1 contains eight VCO stages, one of which is outlined as VCO stage 200. The VCO stages of FIG. 1 may further be grouped into loop elements containing complementary VCO stages, as illustrated by loop element 180 which contains the two complementary VCO stages associated with outputs φ 225 and φ 045. Thus, the loop element containing the complementary VCO stages associated with phases φ 000 and φ 180 corresponds to a preceding loop element that provides primary signal path outputs φ 000 and φ 180 to inverters 120 and 160, respectively. Furthermore, the loop element containing the complementary VCO stages associated with φ 315 and φ 135 corresponds to a two-prior loop element providing the feed-forward outputs φ 315 and φ 135 to feed-forward inverters 128 and 168, respectively. Each VCO stage further includes a cross-coupled inverter 125/126 for receiving a complementary output from the complementary VCO stage within the loop element. For example, the VCO stage associated with φ 225 includes cross-coupled inverter 126 for receiving complementary output φ 000 and φ 045 from the complementary VCO stage within loop element 180. Thus, loop elements as described below are defined by phase relationships between VCO stages of the VCO, and not necessarily physical layout.

Figure 2:
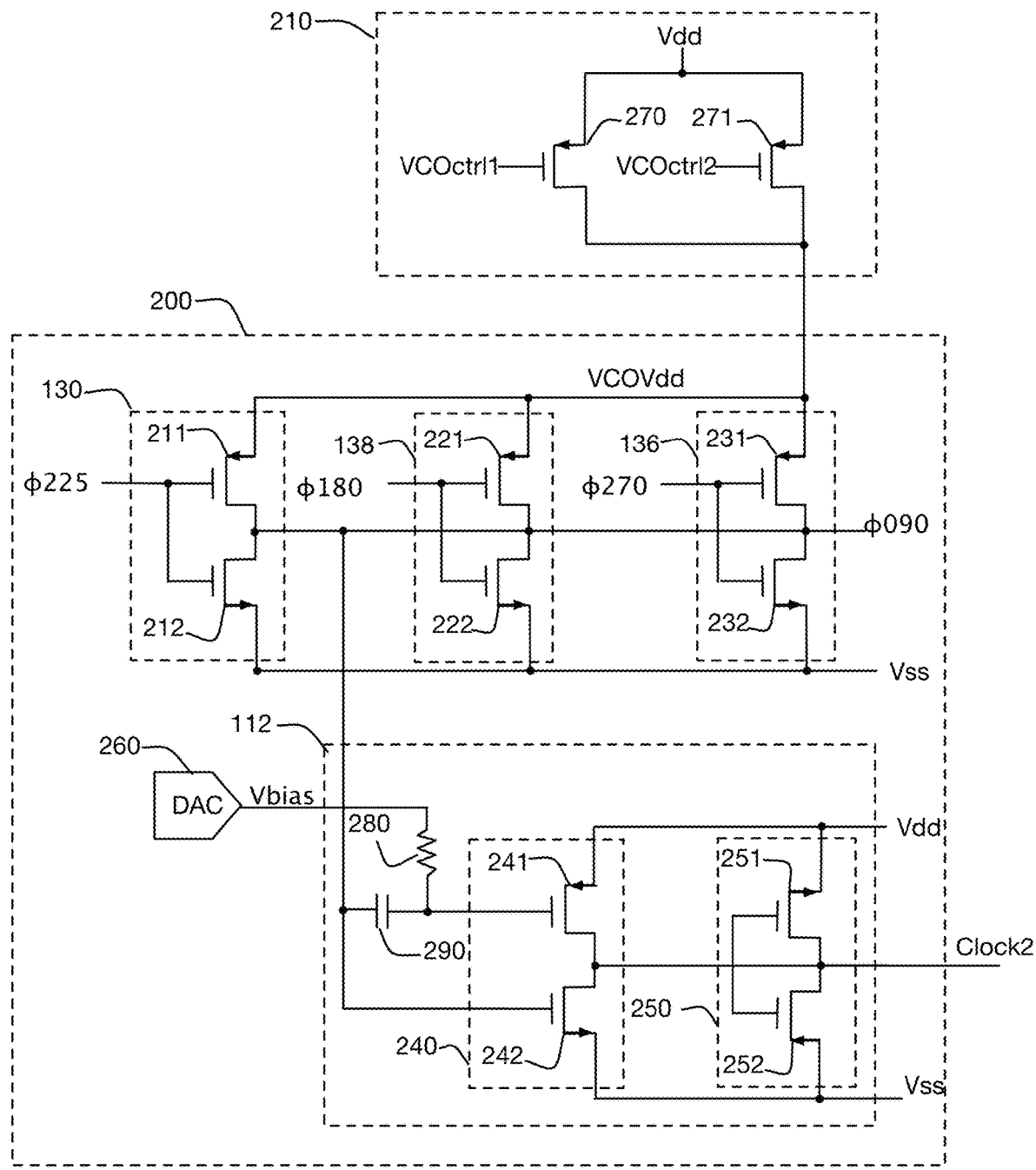
FIG. 2 is a schematic detailing one embodiment of one of eight identical sections of the loop oscillator of FIG. 1.

FIG. 2 is a transistor-level illustration detailing one VCO stage 200 of the loop oscillator of FIG. 1, corresponding to primary path inverter 130, feed-forward inverter 138, and cross-coupled inverter 136. For purposes of illustration and without implying limitation, each inverter is drawn as a simple two transistor CMOS structure; thus primary inverter 130 of the first loop is composed of transistors 210 and 211, feed-forward inverter 138 is composed of transistors 230 and 231, and cross-coupled inverter 136 is composed of transistors 250 and 251, all driving common output node ø090. In the particular embodiment described above, transistors 211 and 212 associated with the primary signal path are sized to provide design-typical output drive currents, herein described as produced by transistors of 1× channel dimensions. Feed-forward transistors 221 and 222 are scaled to 0.6× channel dimensions, thus providing approximately 60% of the primary signal path output drive current. Cross-coupling transistors 231 and 232 are scaled to 0.4× channel dimensions, thus providing approximately 40% of the primary signal path output drive current.

As the output current and thus the output slew rate of a CMOS inverter varies with its supply voltage, the varying output slew rate of each inverter into its output node capacitance will result in a variation of propagation delay with supply voltage, providing a mechanism for adjusting the loop oscillation frequency. As detailed in FIG. 2, inverters 130, 138, and 136 are powered by a controlled voltage VCOVdd, produced by power control circuit 210. Within 210, Pass transistor 270 controlled by a first VCO control signal VCOctrl1 contributes to the collective tail current output by 190 onto controlled voltage bus VCOVdd; similarly, pass transistor 271 controlled by a second VCO control signal VCOctrl2 also contributes to the collective tail current output by 190. The relative channel size and thus current capability of pass transistors 270 and 271 may differ, allowing the relative control effect of the two control signals to differ. In one embodiment, VCOctrl1 is produced by a PLL component providing a proportional phase error component associated with high-frequency phase comparisons, and VCOctrl2 is produced by a PLL component providing an integral component associated with an accumulation of phase comparisons. In one particular instance of that embodiment, pass transistor 270 is smaller than pass transistor, allowing VCCctrl2 to provide a higher-magnitude, and VCCctrl1 to have a lower-magnitude effect on VCO frequency. In an alternative embodiment, each of pass transistors 270 and 271 are comprised of sets of one or more parallel instances of a pass transistor, the sets 270 and 271 thus collectively providing differing control effects in a ratio proportional to the number of transistors in set 270 versus the number of transistors in set 271. In other embodiments, a single control signal VCOctrl1 is sufficient, and only pass transistor 270 is required within 210. In many embodiments, one instance of power control circuit 210 produces controlled voltage VCOVdd used by all instances of 200. In embodiments utilizing individual gate delay adjustment as taught in [Tajalli I], separate instances of 210 may be used for individual loop elements, or individual loop segments 200.

For the inverter structures shown in FIG. 2, the output voltage swing at each loop node will span Vss to VCOVdd, i.e. a varying range. Thus, one embodiment capacitively couples 290 the VCO output phase to a buffer/driver circuit 112, to provide a consistent output level and drive capability. A non-inverting buffer/driver incorporating two inverting buffers 240 and 250 is illustrated, without implying limitation.

In one particular embodiment, capacitively coupling 290 the input signal to only the PMOS buffer input 241 was found to be sufficient, with the NMOS buffer input 242 being driven directly. A bias resistor 280 and configurable voltage Vbias is shown to providing an input bias to the PMOS gate. In other embodiments, the conventional practice of capacitively coupling a signal and bias voltage to both gate inputs may be used. Embodiments utilizing a different digital logic family (e.g. CML) for the VCO elements may incorporate other known solutions for logic family level conversion into the design of FIG. 2.

Figure 3:
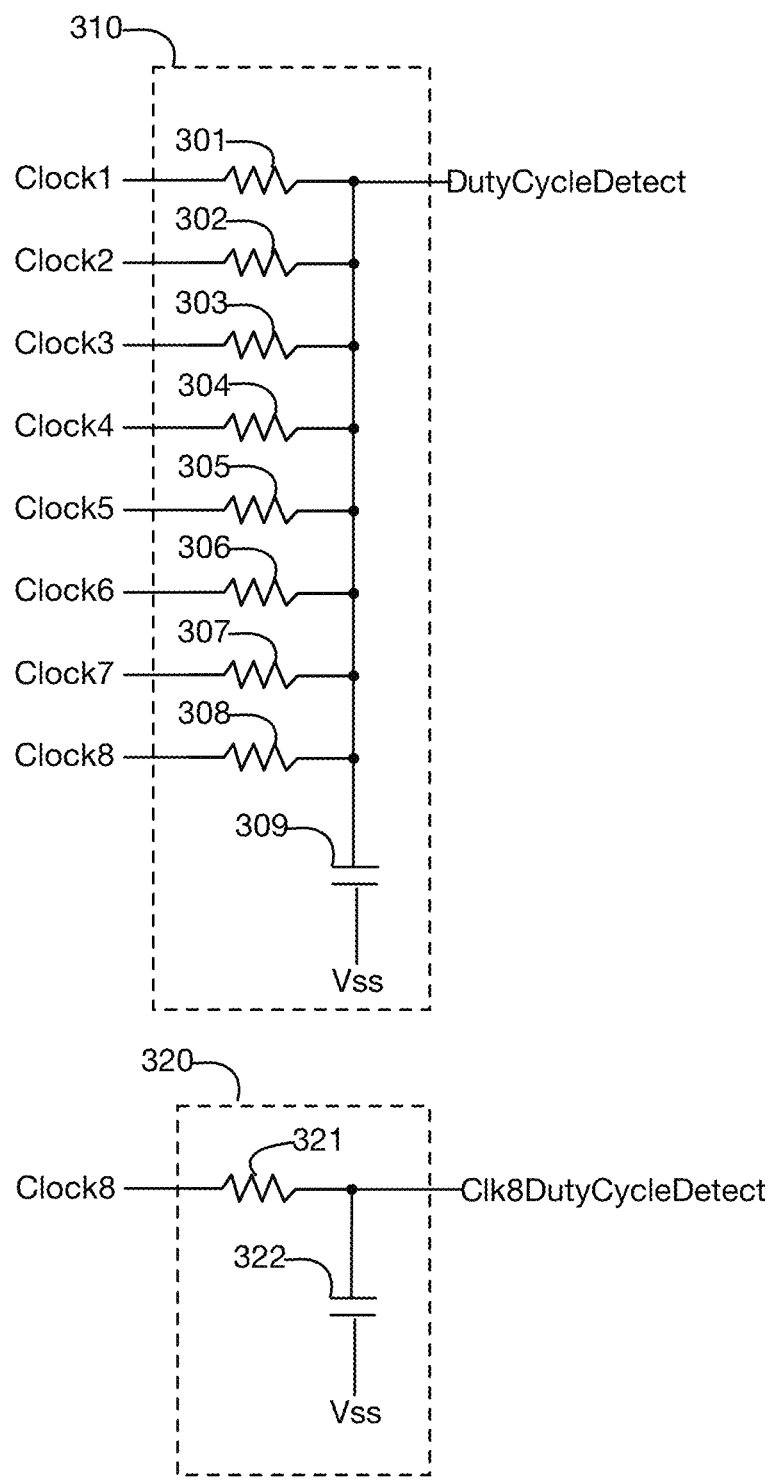
FIG. 3 is a schematic illustrating two embodiments which may be used as part of a duty cycle controller.

Asymmetrical switching thresholds between PMOS and NMOS inverter or buffer elements, or variations from one section of the loop to another may result in undesirable periodic modulations of the resulting clock outputs. In particular, deviations from exact 50% duty cycle outputs may be detrimental. FIG. 3 illustrates two methods of measuring VCO output duty cycle errors. Circuit 310 takes advantage of the expected balance between complementary output phases, and even spacing between adjacent phases to reduce the need for heavy low-pass filtering to obtain a consensus common mode voltage result. Isolation resistors 301 through 308 linearly sum the eight clock phases Clock1 through Clock8 to produce analog result DutyCycleDetect. If all phases are exactly symmetrical 50% duty cycle full-swing CMOS square waves with equal inter-phase phase differences, the DC level of DutyCycleDetect will be exactly Vdd/2. In some embodiments, filter capacitor 309 may be used to reduce ripple on the output signal. A control/measurement subsystem may observe the actual value, and then incrementally adjust 260 Vbias in one or more oscillator sections 200 to minimize deviation from the desired result.

Alternatively, a circuit similar to 320 may be used on each clock output, with Clock8 used here as one example. As before, if the full-swing CMOS clock is an exact 50% duty cycle square wave and is substantially low-pass filtered to obtain its average DC level, the result should be exactly Vdd/2. In one embodiment, a R/C time constant 321, 322 approximately 1000 times longer than the clock period was used. As before, a control/measurement subsystem may observe the actual value, and then incrementally adjust Vbias in that clock output's section 200 to minimize deviation from the desired result.

Figure 4:
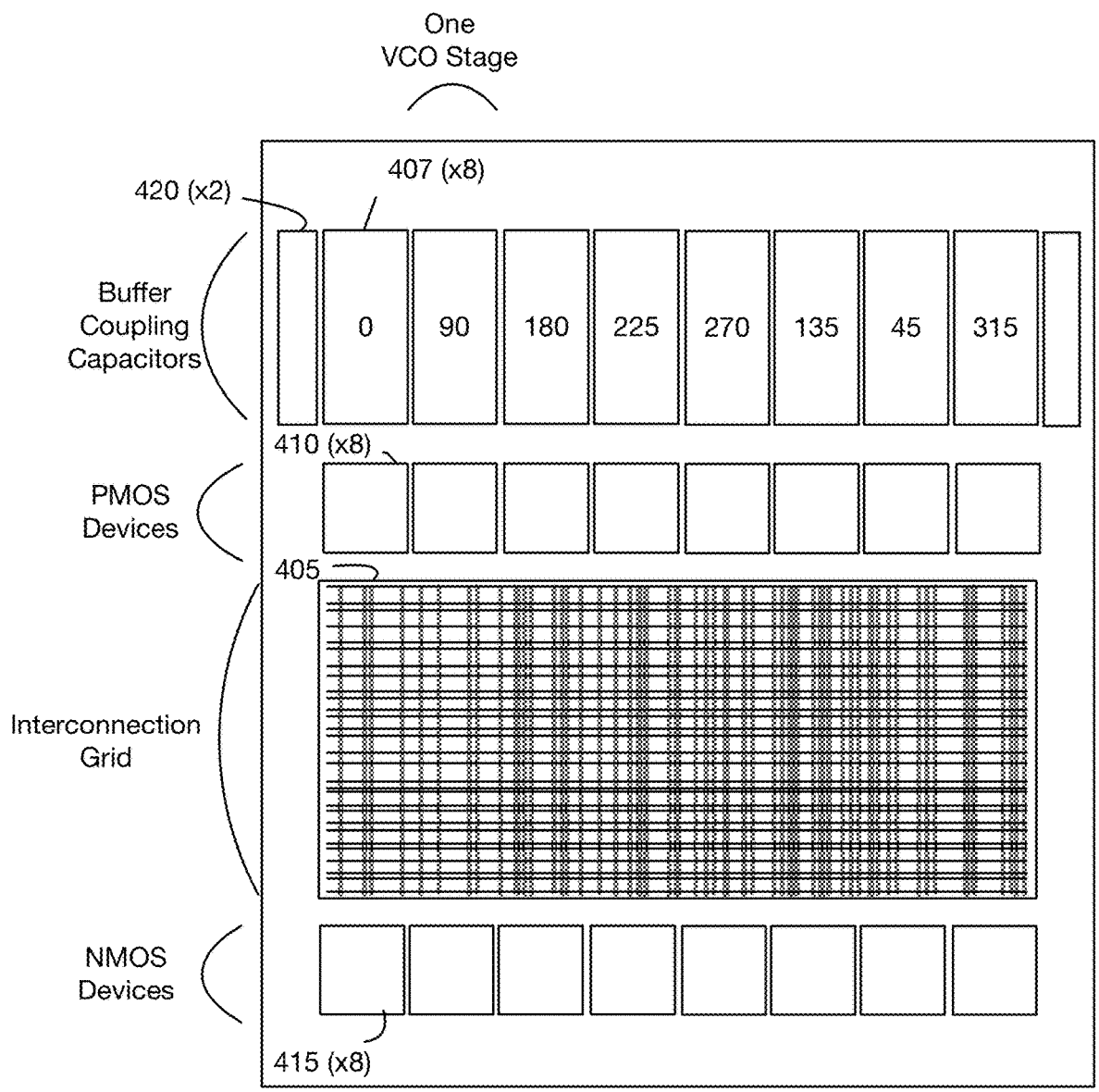
FIG. 4 illustrates a physical integrated circuit layout for one particular embodiment having eight VCO stages.

FIG. 4 illustrates an exemplary physical integrated circuit layout of one embodiment as in FIGS. 1 and 2. Rather than grouping circuit elements by function, e.g. VCO stage elements together and then buffer elements, circuit elements are grouped first as identical VCO stages, and then within each VCO stage by component type, e.g. capacitors, PMOS transistors, NMOS transistors.

Figure 5:
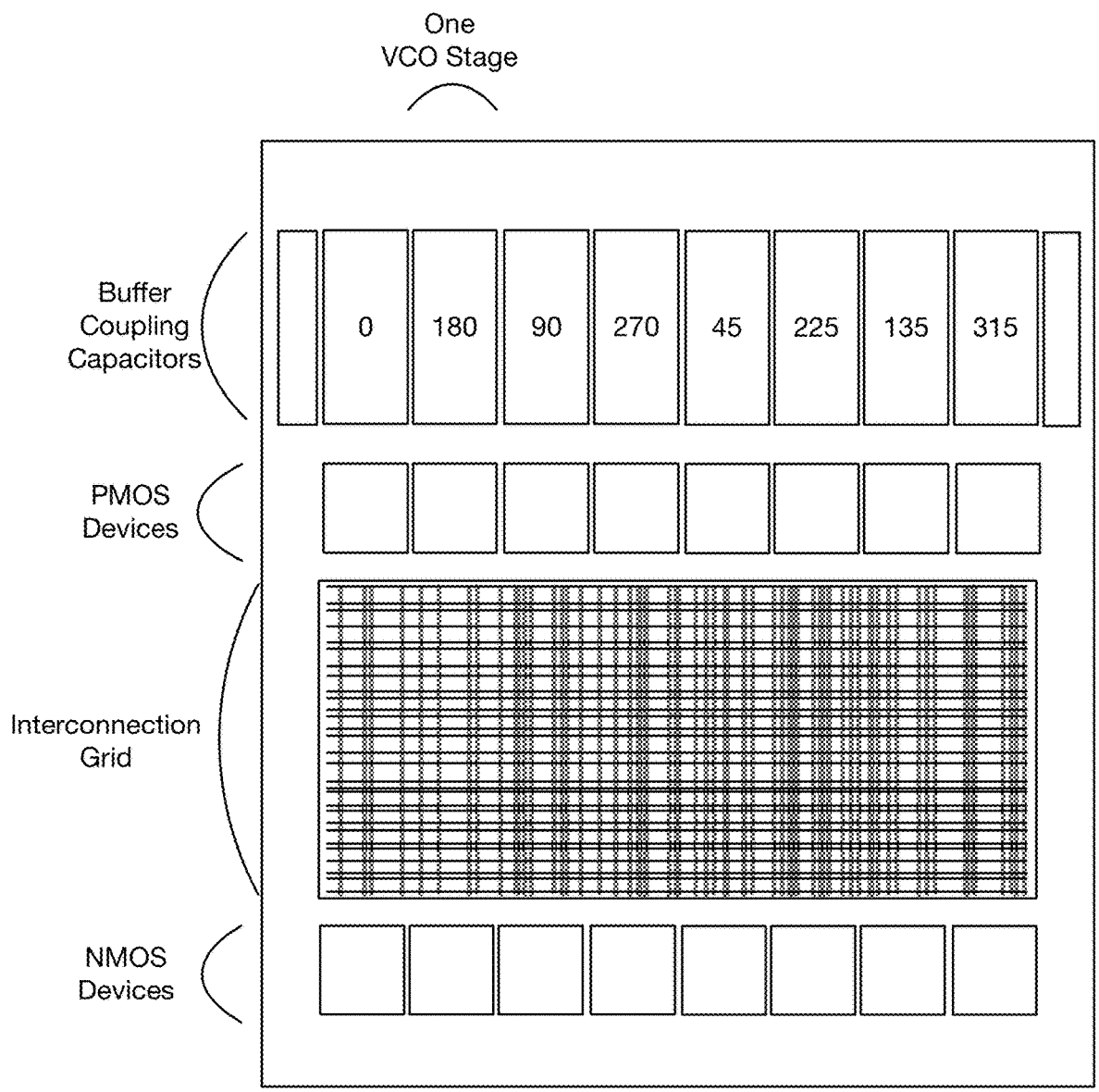
FIG. 5 illustrates a physical integrated circuit layout for a second embodiment having eight VCO stages.
Figure 6:
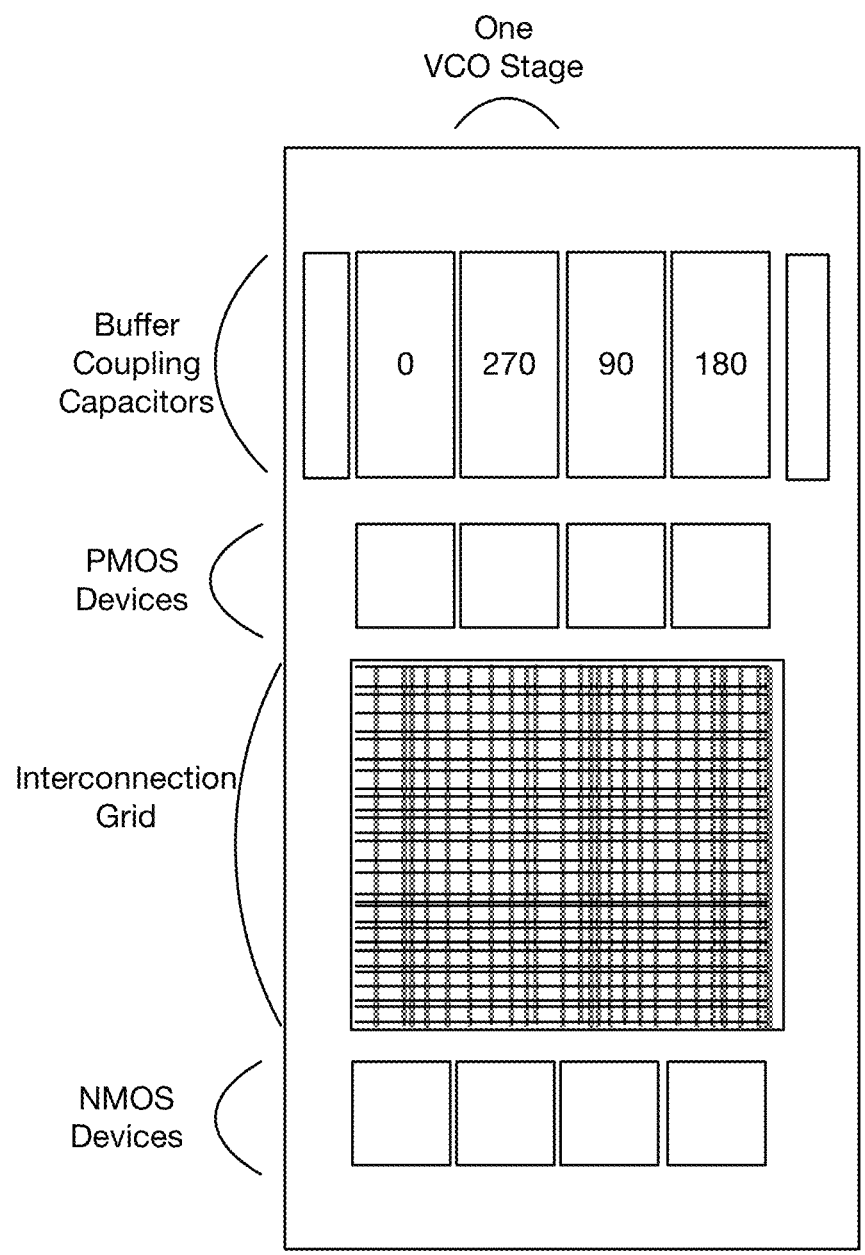
FIG. 6 illustrates a physical integrated circuit layout for an embodiment having four VCO stages.

The floor plan of FIG. 4 is shown to be logically divided into eight identical strips, each strip containing all of the elements of one VCO stage. Specifically, each VCO stage includes a plurality of inverters, where each inverter is arranged along a second dimension (shown in FIG. 4 as the vertical axis). The plurality of inverters include (i) an inverter configured to receive an output of a VCO stage in a preceding loop element, (ii) a feed-forward inverter configured to receive a feed-forward output VCO stage in a two-prior loop element, and (iii) a cross-coupled inverter configured to receive a complementary output from a complementary VCO stage within the same loop element. Furthermore, each VCO stage includes buffer inverters for generating the VCO outputs on the metallization layers of the interconnection grid. As shown, FIG. 4 includes an interconnection grid 405 having metallization layers configured to provide (i) interconnections between inverters in a plurality of VCO stages, the plurality of VCO stages repeated along a first dimension (shown in FIG. 4 as the horizontal axis) and (ii) a set of VCO outputs from the plurality of VCO stages. Vertically, each VCO stage is composed of a capacitor, PMOS transistors 410, a portion of interconnection wiring channel 405, and NMOS transistors 415. The PMOS transistors 410 and NMOS transistors 415 make up the plurality of inverters of each VCO stage. As shown in FIG. 4, each VCO stage of the plurality of VCO stages includes (i) a capacitive coupling element 407 and a PMOS portion 410 of each inverter of the plurality of inverters arranged on one side of the interconnection grid 405 and (ii) an NMOS portion 415 of each inverter of the plurality of inverters arranged on an other side of the interconnection grid. This unusual functional layout results in minimized wiring delay within each segment. True and complementary segments are placed next to each other, again to minimize wiring delays in the cross-coupled structures that maintain tight 180 degree phase relationship between them. However, the order of VCO stages along the first direction is permuted from a strict sequential order, e.g. 0-45-90-135-180-225-270-315, to a gray counting sequence such as the nonlimiting example 0-90-180-225-270-135-45-315, as shown in FIG. 4. Another exemplary order is shown in FIG. 5. In FIG. 5, the sequence is 0-180-90-270-45-225-135-315. In the embodiment of FIG. 5, the VCO stages are grouped according to loop elements, and thus every VCO stage is adjacent to at least its complementary stage. Such a reordering balances the average segment interconnection length, so that rather than many segment interconnections being one unit long and the first-to-last loop closing connection being 8 units long, most interconnection lengths are 4-5 units. FIG. 6 illustrates a VCO layout having four VCO stages, in accordance with such an embodiment. In FIG. 6, the VCO stages are ordered 0-270-90-180.

The arrangement of components within a VCO stage also minimizes wiring delays and parasitic node capacitances. The physical size of the AC coupling capacitor 290 connecting an oscillator output to a buffer input is relatively large compared to the rest of the circuitry of FIG. 2. Thus, it is beneficial to locate it adjacent to the PMOS transistors it couples to, to avoid long wire runs. Allowing a generous area for horizontal inter-segment wires and vertical intra-segment connections allows efficient routing, with in-phase signals run on top of each other to minimize Miller capacitance.

Finally, half-width "dummy" segments 420 are placed on the outsides of the bordering VCO stages (shown as the VCO stages at the extreme left and right of the iterated array of VCO stages), so that the bordering VCO stages of the eight active VCO stages do not see a difference in inter-segment parasitics compared to the inner VCO stages.

The particular examples of four inverters per VCO stage and two differential outputs per VCO stage do not imply a limitation in either minimum or maximum, although the available phase differences within a two element loop will generally preclude use of feed-forward speedup as described herein. Similarly, the CMOS loop inverters used for descriptive purposes above may alternatively utilize CML or other digital design conventions, or equivalent analog amplifier/buffer conventions.

We claim:

1. An apparatus comprising:
   an interconnection grid having metallization layers configured to provide (i) interconnections between a plurality of loop elements containing voltage controlled oscillator (VCO) stages, the plurality of VCO stages repeated along a first dimension and (ii) a set of VCO outputs from the plurality of VCO stages;
   each given VCO stage of the plurality of VCO stages comprising a plurality of inverters, each inverter arranged along a second dimension, the plurality of inverters comprising (i) a primary path inverter configured to receive an output of a VCO stage in a preceding loop element with respect to a loop element containing the given VCO stage, (ii) a feed-forward inverter configured to receive a feed-forward output from a VCO stage in a two-prior loop element with respect to the loop element containing the given VCO stage, (iii) a cross-coupled inverter configured to receive a complementary output from a complementary VCO stage within the loop element containing the given VCO stage, and (iv) buffer inverters for generating the VCO outputs on the metallization layers of the interconnection grid, each VCO stage of the plurality of VCO stages having:
   (i) a capacitive coupling element and a PMOS portion of each inverter of the plurality of inverters arranged on one side of the interconnection grid; and
   (ii) an NMOS portion of each inverter of the plurality of inverters arranged on an other side of the interconnection grid.

2. The apparatus of claim 1, wherein the VCO stages are arranged along the first direction such that at least two adjacent VCO stages are associated with complementary phases of the set of VCO outputs.

3. The apparatus of claim 1, further comprising dummy capacitors arranged next to the capacitive couple elements of a pair of bordering VCO stages of the plurality of VCO stages, the dummy capacitors matching inter-segment capacitive coupling of the bordering VCO stages to a plurality of inner VCO stages of the plurality of VCO stages.

4. The apparatus of claim 1, wherein the plurality of VCO stages comprises four VCO stages.

5. The apparatus of claim 4, wherein the four VCO stages comprise a 0-degree stage, a 90-degree stage, a 180-degree stage, and a 270-degree stage.

6. The apparatus of claim 5, wherein the four VCO stages are arranged along the first dimension in a sequential order of the 0-degree stage, the 270-degree stage, the 90-degree stage, and the 180-degree stage.

7. The apparatus of claim 6, further comprising a pair of dummy capacitors bordering the 0-degree stage and the 180-degree stage.

8. The apparatus of claim 1, wherein for each VCO stage, the cross-coupled inverter is approximately 0.4× a size of the inverter configured to receive the output of the VCO stage in the preceding loop element.

9. The apparatus of claim 1, wherein for each VCO stage, the feed-forward inverter is approximately 0.6× a size of the inverter configured to receive an output of the VCO stage in the preceding loop element.

10. The apparatus of claim 1, wherein the plurality of VCO stages comprises eight VCO stages grouped into four loop elements.

11. The apparatus of claim 10, wherein each loop element comprises complementary VCO stages.

12. The apparatus of claim 1, wherein each VCO stage is adjacent to at least the complementary VCO stage.

* * * * *